US009128164B2

(12) United States Patent
Mizoguchi

(10) Patent No.: US 9,128,164 B2
(45) Date of Patent: Sep. 8, 2015

(54) BATTERY MONITORING APPARATUS

(71) Applicant: DENSO CORPORATION, Kariya, Aichi-pref. (JP)

(72) Inventor: Tomomichi Mizoguchi, Inazawa (JP)

(73) Assignee: DENSO CORPORATION, Kariya (JP)

( * ) Notice: Subject to any disclaimer, the term of this patent is extended or adjusted under 35 U.S.C. 154(b) by 52 days.

(21) Appl. No.: 14/140,911

(22) Filed: Dec. 26, 2013

(65) Prior Publication Data

US 2014/0176149 A1    Jun. 26, 2014

(30) Foreign Application Priority Data

Dec. 26, 2012   (JP) ................ 2012-282694

(51) Int. Cl.
*G01N 27/416* (2006.01)
*G01R 31/36* (2006.01)

(52) U.S. Cl.
CPC ................. *G01R 31/3658* (2013.01)

(58) Field of Classification Search
CPC .................................................. G01R 31/3658
USPC .......... 324/426, 433, 434; 320/107, 116, 132, 320/134, 136
See application file for complete search history.

(56) References Cited

U.S. PATENT DOCUMENTS

| 8,518,570 | B2 | 8/2013 | Kudo et al. |
| 2008/0284375 | A1 | 11/2008 | Nagaoka et al. |
| 2010/0209748 | A1 | 8/2010 | Kudo et al. |
| 2012/0141848 | A1 | 6/2012 | Nagaoka et al. |
| 2012/0194135 | A1 | 8/2012 | Mizoguchi |
| 2012/0194199 | A1 | 8/2012 | Mizoguchi |
| 2012/0306507 | A1* | 12/2012 | Fujimatsu ............ 324/434 |

(Continued)

FOREIGN PATENT DOCUMENTS

| JP | 2009-103546 | 5/2009 |
| JP | 2010-193589 | 9/2010 |
| JP | 2011-217606 | 10/2011 |

(Continued)

OTHER PUBLICATIONS

Office Action (2 pages) dated Nov. 4, 2014 issued in corresponding Japanese Application No. 2012-282694 and English translation (2 pages).

(Continued)

*Primary Examiner* — Richard Isla Rodas
*Assistant Examiner* — Nathaniel Pelton
(74) *Attorney, Agent, or Firm* — Nixon & Vanderhye PC

(57) ABSTRACT

A battery monitoring apparatus a plurality of connection lines, a monitoring circuit, a first filter circuit, and a second filter circuit. The monitoring circuit is provided with a pair of sensing terminals for each pair of positive and negative electrode terminals of each of a plurality of battery cells of a battery pack. The plurality of connection lines includes a plurality of common line and first and second branch lines. The first filter circuit includes first resistors located on the first and second branch lines connected to the pair of sensing terminals, and a first capacitor located between the first and second branch lines connected to the pair of sensing terminals. The second filter circuit includes a second resistor located on the plurality of connection lines, and a second capacitor connected in series between the plurality of connection lines without passing through the first resistors or the second resistor.

14 Claims, 5 Drawing Sheets

(56) References Cited

U.S. PATENT DOCUMENTS

2013/0110430 A1* 5/2013 Nishi et al. ............ 702/63
2013/0300371 A1* 11/2013 Bills ...................... 320/118

FOREIGN PATENT DOCUMENTS

JP 2012-159406 8/2012
JP 2012-159407 8/2012

OTHER PUBLICATIONS

Japanese Office Action (2 pages) dated Jun. 2, 2015, issued in corresponding Japanese Application No. 2012-282694 and English translation (2 pages).

* cited by examiner

BATTERY MONITORING APPARATUS

CROSS-REFERENCE TO RELATED APPLICATION

This application is based on and claims the benefit of priority from earlier Japanese Patent Application No. 2012-282694 filed on Dec. 26, 2012, the description of which is incorporated herein by reference.

BACKGROUND

1. Technical Field

The present invention relates to a battery monitoring apparatus that includes a monitoring circuit for monitoring individual cell voltages of a plurality of battery cells which are connected in series to form a battery pack.

2. Related Art

A battery monitoring apparatus in related art is proposed that includes a monitoring circuit and a low-pass filter (for example, see JP-A-2012-159406). The monitoring circuit is provided with a plurality of pairs of sensing terminals for a plurality of battery cells. The pairs of sensing terminals are associated with the plurality of battery cells of which positive and negative electrode terminals are connected to each of the sensing terminals in a pair via individual connecting lines. The low-pass filter is disposed on the connecting lines.

Each of a plurality of current paths is formed between each of the battery cells and the monitoring circuit via the corresponding connecting lines. In the case where the number of components of the low-pass filter is different between the current paths, the cutoff frequency of the low-pass filter may be varied.

From this, a circuit configuration of JP-A-2012-159406 is designed such that the low-pass filter is configured by an RC (resistor-capacitor) filter composed of a resistor and a capacitor with the same number of components of the low-pass filter between the current paths.

Specifically, the connecting lines on the battery pack side are provided with a plurality of common lines. Each of the common lines is connected to the negative electrode terminal of a high-potential side battery cell of serially connected adjacent battery cells and to the positive electrode terminal of a low-potential side battery cell of serially connected adjacent battery cells.

The connecting lines on the monitoring circuit side are provided with two branch lines into which each of the common lines is branched. One of the two branch lines is connected to a sensing terminal that corresponds to the negative electrode terminal of the high-potential side battery cell. The other of the two branch lines is connected to a sensing terminal that corresponds to the positive electrode terminal of the low-potential side battery cell.

The low-pass filter includes resistors and capacitors. The resistors are located on a pair of branch lines that correspond to a pair of terminals (positive and negative electrode terminals) of the monitoring circuit. The capacitors are located between the pair of branch lines.

The filter configuration disclosed in JP-A-2012-159406 has a feature of sufficiently attenuating differential noise (in-phase fluctuation) generated between the individual connecting lines that connect the battery cells to the monitoring circuit. However, this filter configuration is not able to sufficiently attenuate common mode noise (in-phase fluctuation) generated between the individual connecting lines and a ground line.

This will be specifically described referring to FIGS. 5 to 8. FIGS. 5 and 7 show an example in which a filter circuit 300 in related art is disposed between a battery pack 100 and a monitoring circuit 200. FIGS. 6 and 8 show Bode diagrams for explaining filter characteristics.

The filter circuit 300 in FIG. 5 has filter characteristics of which a transfer function G(s) (=Vo1/Vi1) of an RC filter for a single battery cell 100*a* is expressed by the following formula F1 and, as shown in FIG. 6, sufficient attenuation is achieved in a high-frequency range in which the frequency f becomes higher than the cutoff frequency fc.

$$G(s)=(Vo1/Vi1)=1/(1+2RCs) \tag{F1}$$

The filter circuit 300 in FIG. 7 has filter characteristics of which a transfer function G(s) (Vo2/Vi2) of an RC filter for n battery cells 100*a* is expressed by the following formula F2 and, as shown in FIG. 8, sufficient attenuation is not achieved in the high-frequency range in which the frequency f becomes higher than the cutoff frequency fc, because resistance components are applied to the output Vo2.

$$(Vo2/Vi2)=[2\{(n-1)/n\}RCs+1]/(1+2nRCs) \tag{F2}$$

In this way, common mode noise is not sufficiently attenuated in the filter configuration disclosed in JP-A-2012-159406, and there is a probability that the common mode noise would enter the monitoring circuit, which leads to the probability of causing malfunction in the monitoring circuit.

In order to cope with common mode noise, a ground-type filter configuration, in which the capacitors are directly grounded for each of the connecting lines, may be used.

In this case, each capacitor for the high-potential side battery cell of the battery cells having a high voltage to ground is required to be configured by a high-voltage capacitor. This raises a problem of drastically increasing the cost incurred in manufacturing the battery monitoring apparatus.

SUMMARY

It is thus desired to provide a battery monitoring apparatus which is able to minimize the impact of common mode noise on a monitoring circuit, without the necessity of providing a ground-type filter configuration.

The present disclosure relates to a battery monitoring apparatus that monitors a battery pack which is configured by a plurality of serially-connected battery cells.

According to an exemplary embodiment of the present disclosure, there is provided a battery monitoring apparatus including: a plurality of connection lines that are connected to each of a pair of positive and negative electrode terminals of each of a plurality of battery cells connected in series to form a battery pack; a monitoring circuit that is provided with a pair of sensing terminals for each pair of positive and negative electrode terminals of each of the plurality of battery cells, and that includes a voltage detection circuit which detects a cell voltage applied to the pair of sensing terminals; a first filter circuit that is provided in a pair of connection lines of the plurality of connection lines connected to the pair of sensing terminals and removes noise generated between the pair of connection lines; and a second filter circuit that removes noise.

In the battery monitoring apparatus of the exemplary embodiment, the plurality of connection lines includes a plurality of common lines and first and second branch lines. The plurality of common lines are connected to a plurality of common terminals which are located between adjacent battery cells of the plurality of battery cells and shared between a negative electrode terminal of a high-potential side battery cell of the adjacent battery cells and a positive terminal of a low-potential side battery cell of the adjacent battery cells. The first and second branch lines are branched from each of the common lines. The first branch line is connected to the negative electrode terminal of the high-potential side battery cell. The second branch line is connected to the positive terminal of the low-potential side battery cell.

The first filter circuit includes first resistors that are located on the first and second branch lines connected to the pair of sensing terminals, and a first capacitor that is located between the first and second branch lines connected to the pair of sensing terminals. The second filter circuit includes a second resistor that is located on the plurality of connection lines, and a second capacitor that is connected in series between the plurality of connection lines without passing through the first resistors or the second resistor.

Thus, the second filter circuit has a filter configuration in which the second capacitors are serially connected without passing through resistance elements. With this filter configuration, common mode noise that would enter the monitoring circuit is sufficiently attenuated in the second filter circuit. Accordingly, the impact of common mode noise on the monitoring circuit is minimized, without the necessity of providing a ground-type filter configuration.

In the battery monitoring apparatus of the of the exemplary embodiment, a cutoff frequency of the second filter circuit may be set to be larger than a cutoff frequency of the first filter circuit.

Thus, the cutoff frequency of the second filter circuit is ensured to be larger than the cutoff frequency of the first filter circuit. This can minimize the fluctuation of the cutoff frequency in the first filter circuit, the fluctuation being attributed to the addition of the second filter circuit.

DESCRIPTION OF EMBODIMENTS

Figure 1:
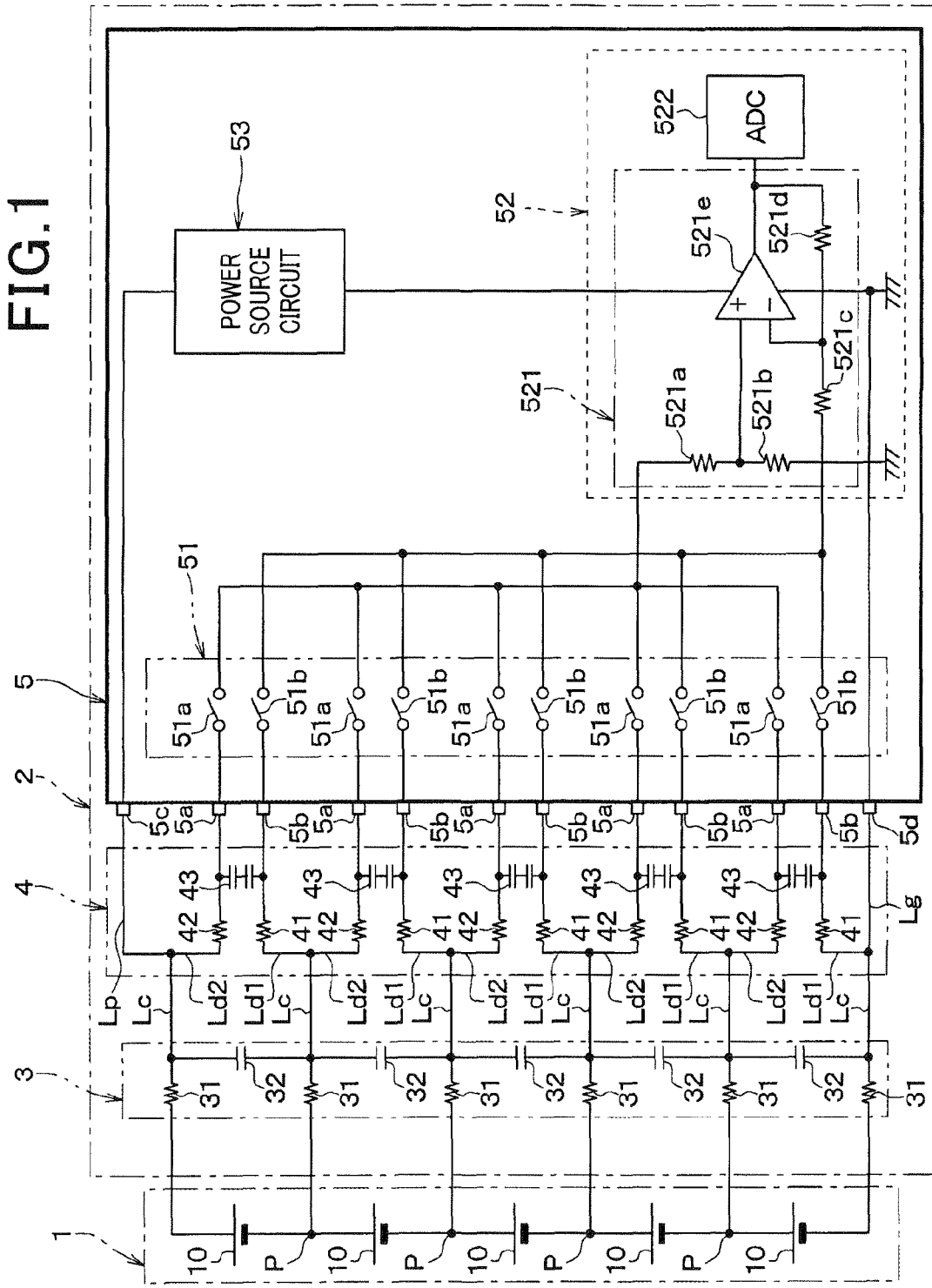
FIG. 1 is a schematic diagram of a battery monitoring apparatus, according to a first embodiment of the present invention.

Hereinafter, some embodiments of the present invention are described with reference to the accompanying drawings. In the following embodiments, components identical with or similar to each other between the embodiments are given the same reference numerals.

First Embodiment

Figure 2:
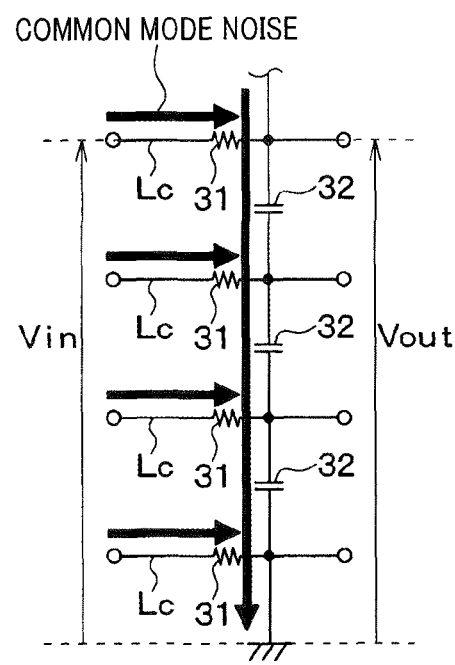
FIG. 2 is a circuit diagram of a second filter circuit, according to the first embodiment.

Referring to FIGS. 1 and 2, a first embodiment of the present invention is described. In the present embodiment, a battery monitoring apparatus 2 is applied to a battery pack 1 which is installed in a vehicle such as a hybrid vehicle or an electric vehicle. In this embodiment, the battery pack 1 and the battery monitoring apparatus 2 configure a battery system for vehicles.

The battery pack 1 serves as a power source that mainly supplies electric power to an electric motor, not shown, used for driving, as well as to various electrical loads installed in the vehicle. As shown in FIG. 1, the battery pack 1 is configured as a serial connection in which a plurality of battery cells 10 composed of secondary cells, such as lithium-ion cells, are connected in series. In the example shown in FIG. 1, the battery pack 1 is configured by five battery cells 10. However, the number of the battery cells 10 configuring the battery pack 1 is not limited to five.

The battery monitoring apparatus 2 that monitors the state of the battery pack 1 mainly includes a plurality of connecting lines which are connected to the terminals at both ends of the individual battery cells 10. The battery monitoring apparatus 2 also includes a first filter circuit 4, a second filter circuit 3, a monitoring circuit 5 and a control unit, not shown.

The connecting lines in the present embodiment include common lines Lc, first and second branch lines Ld1 and Ld2, a power source line Lp, and a ground line Lg described below.

Specifically, on the battery pack 1 side, the connecting lines include the common lines Lc. Each of common lines Lc is connected to a common terminal P which is located between adjacent battery cells 10 and shared between the negative electrode terminal of a high-potential side battery cell 10 (hereinafter also referred to as "high-potential battery cell") and the positive electrode terminal of a low-potential side battery cell 10 (hereinafter also referred to as "low-potential battery cell").

On the monitoring circuit 5 side, the connecting lines include the first and second branch lines Ld1 and Ld2 branched from each of the common lines Lc. The pairs of branch lines Ld1 and Ld2 connect, via the respective common lines Lc, the terminals at both electrode terminals (positive and negative electrode terminals) of the individual battery cells to respective pairs of sensing terminals 5a and 5b provided to the monitoring circuit 5.

Specifically, in each first branch line Ld1, one end is connected to the common line Lc, and the other end is connected to a sensing terminal 5b that is provided to the monitoring circuit 5 (described later) and corresponds to the negative electrode terminal of a high-potential battery cell. In each second branch line Ld2, one of both ends is connected to the common line Lc, and the other of both ends is connected to a sensing terminal 5a that is provided to the monitoring circuit 5 and corresponds to the positive electrode terminal of a low-potential battery cell.

In the battery cell 10 having a highest potential among the battery cells 10, the positive electrode terminal is connected to the connecting line functioning as the power source line Lp that is connected to a power source terminal 5c of the monitoring circuit 5. In the battery cell 10 having a lowest potential among the battery cells 10, the negative electrode terminal is connected to the connecting line functioning as the ground line Lg that is connected to a ground terminal 5d of the monitoring circuit 5.

The first filter circuit 4 is provided to pairs of connecting lines, which are connected to the respective pairs of sensing terminals 5a and 5b that are provided to the monitoring circuit 5. The first filter circuit 4 serves as a low-pass filter that removes noise (differential noise) generated between connecting lines in a pair. The first filter circuit 4 of the present embodiment is configured by a plurality of RC (resistor-capacitor) filters that are provided for the respective battery cells 10.

Specifically, the first filter circuit 4 includes a set of resistors (first resistors) 41 and 42, and first capacitors 43. The resistors 41 and 42 are disposed in the branch lines Ld1 and Ld2, respectively, which are connected to the pair of electrode terminals of the corresponding one of the battery cells 10. The first capacitors 43 are disposed between the branch lines Ld1 and Ld2 which are connected to the pair of electrode terminals of the corresponding one of the battery cells 10.

In the first filter circuit 4 configured as described above, the number of the components of the first filter circuit 4 in the current paths, which are formed by the connecting lines, is the same between the current paths. Accordingly, fluctuation of the cutoff frequency between the current paths is minimized in the first filter circuit 4.

However, in the first filter circuit 4, resistance components are applied to the output side of the RC filters that correspond to the respective plurality of battery cells 10. Therefore, when common mode noise (in-phase fluctuation) is generated in the common lines Lc, it is difficult to sufficiently attenuate the common mode noise in a high-frequency range.

The second filter circuit 3 removes noise which is difficult to be attenuated by the first filter circuit 4. The noise is common mode noise generated between the ground line Lg or the power source line Lp and the individual connecting lines. The second filter circuit 3 of the present embodiment includes a plurality of RC filters that correspond to the respective battery cells 10.

There is a probability that common mode noise enters the monitoring circuit 5 through both the power source line Lp and the ground line Lg. Therefore, in the second filter circuit 3 of the present embodiment, each of the ends thereof is connected to both of the power source line Lp and the ground line Lg.

The second filter circuit 3 of the present embodiment includes second resistors 31 disposed in the respective connecting lines, and second capacitors 32, each being connected between the connecting lines.

Specifically, the second resistors 31 are disposed in the respective common lines Lc. The second resistors 31 also function as current limiting means that limit the flow of current between the battery pack 1 and the monitoring circuit 5. The second capacitors 32, which are each disposed between the common lines Lc, are connected in series without passing through the second resistors 31.

As shown in FIG. 2, in the second filter circuit 3 configured as described above, the serially connected second capacitors 32 function as a bypass for common mode noise. No resistance components are interposed into the serially connected second capacitors 32, and then, no resistance components are applied to an output Vout side of the RC filters that correspond to the respective battery cells 10. Accordingly, in the event that common mode noise (in-phase fluctuation) is generated in the common lines Lc, the common mode noise is sufficiently attenuated in a high-frequency range.

In the present embodiment, the cutoff frequency of the second filter circuit 3 is designed so as to be higher than the cutoff frequency of the first filter circuit 4. Specifically, in the second filter circuit 3 of the present embodiment, each second resistor 31 is configured by an element whose resistance is smaller (e.g., 10Ω) than the resistance of each of the first resistors 41 and 42 (e.g., 160Ω). Also, each second capacitor 32 is configured by an element whose capacity is smaller (e.g., half) than that of each first capacitor 43.

As shown in FIG. 1, the monitoring circuit 5 serves as a voltage monitoring means that monitors the cell voltage of each of the battery cells 10 of the battery pack 1. Specifically, the monitoring circuit 5 is an integrated circuit that includes a multiplexer 51, a voltage detection circuit 52 and a power source circuit 53.

The monitoring circuit 5 is provided with the pairs of sensing terminals 5a and 5b that correspond to the respective battery cells 10. Specifically, the sensing terminals 5a and 5b in each pair correspond to a pair of electrode terminals of the corresponding one of the battery cells 10. The monitoring circuit 5 is configured to be driven, using the battery pack 1 as a power source, and is provided with the power source terminal 5c connected to the power source line Lp, and a ground terminal 5d connected to the ground line Lg.

The multiplexer 51 includes groups of switches to selectively connect each pair of sensing terminals 5a and 5b that correspond to the pair of electrode terminals of the corresponding one of the battery cells 10, to the voltage detection circuit 52. Specifically, the multiplexer 51 includes positive-electrode-side switches 51a connected to the respective sensing terminals 5a which correspond to the positive electrode terminals of the respective battery cells 10, and includes negative-electrode-side switches 51b connected to the respective sensing terminals 5b which correspond to the negative electrode terminals of the respective battery cells 10.

Each of the switches 51a and 51b is a semiconductor switch configured such as by a transistor. The switches 51a and 51b are turned on in response to a control signal received from the control unit which will be described later. The switches 51a and 51b that are turned on correspond to the pair of electrode terminals of the battery cell 10 which is a voltage-detected target.

The voltage detection circuit 52 amplifies and detects a potential difference between the paired sensing terminals 51 and 5b which correspond to the pair of electrode terminals of the battery cell 10 which is a voltage-detected target. The voltage detection circuit 52 includes a differential amplifier circuit 521 and an AD (analog-to-digital) converter (ADC) 522.

The differential amplifier circuit 521 includes a plurality of resistors 521a, 521b, 521c and 521d, and an operational amplifier 521e. The operational amplifier 521e has a non-inverted input terminal (+) and an inverted input terminal (−). The non-inverted input terminal (+) is connected to a connection point between the resistor 521a and the resistor 521b. The resistor 521a is connected to the individual positive-electrode-side switches 51a. The resistor 521b is connected to the ground. The inverted input terminal (−) is connected to a connection point between the resistor 521c and the resistor 521d. The resistor 521c is connected to the individual negative-electrode-side switches 51b. The resistor 521d is connected to an output terminal of the operational amplifier 521e.

The AD converter 522 is connected to the output terminal of the operational amplifier 521e. The AD converter 522 converts an analog signal that has been amplified by the differential amplifier circuit 521 to the corresponding digital signal which is equivalent to the voltage of the battery cell 10, and outputs the converted digital signal to the control unit.

The control unit includes a microcomputer and its peripheral devices. The microcomputer includes a central processing unit (CPU) and various memories that configure a storage means. The control unit is ensured to perform various processes according to a control program stored in the storage means. The control unit of the present embodiment outputs various control signals or the like to the monitoring circuit 5, and monitors the state of the battery cells 10 on the basis of the results of monitoring, which have been acquired from the monitoring circuit 5.

Next, the operation of the battery monitoring apparatus 2 in detecting cell voltages of the battery cells 10 is described. First, the control unit outputs a control signal at a predetermined timing to the monitoring circuit 5 to instruct detection of the cell voltages of the individual battery cells 10.

In the monitoring circuit 5, the switches 51a and 51b of the multiplexer 51 are turned on/off in a predetermined order, in response to the control signal. Thus, the cell voltages of the battery cells 10 are sequentially applied to the respective pairs of sensing terminals 5a and 5b of the monitoring circuit 5. Then, the voltage applied to each of the pairs of sensing terminals 5a and 5b is detected by the voltage detection circuit 52 and outputted to the control unit as the results of the monitoring of the cell voltages of the battery cells 10 of the monitoring circuit 5.

As described above, the battery monitoring apparatus 2 of the present embodiment includes the first filter circuit 4 and the second filter circuit 3. The first filter circuit 4 removes noise generated between the connecting lines which connect the battery cells 10 to the monitoring circuit 5. The second filter circuit 3 removes noise which is difficult to be removed by the first filter circuit 4.

The second filter circuit 3 of the present embodiment has a filter configuration in which the second capacitors 32 are connected in series without passing through the second resistors 31. Accordingly, no resistance components are applied to the output side of the RC filters that correspond to the respective plurality of battery cells 10. Thus, even when common mode noise (in-phase fluctuation) is generated in the common lines Lc, the second filter circuit 3 is able to sufficiently attenuate the common mode noise in a high-frequency range.

The second filter circuit 3 has a configuration in which the second capacitors 32 are connected in series. Thus, it is not required to increase the capacity of each of the capacitors that correspond to the respective high-potential side battery cells 10, unlike in a ground-type filter in which the individual capacitors are directly connected to the ground.

According to the battery monitoring apparatus 2 of the present embodiment, the impact of common mode noise on the monitoring circuit 5 side is minimized, without the necessity of providing a ground-type filter configuration. As a result, the cost incurred in manufacturing the battery monitoring apparatus 2 is remarkably reduced and the noise immunity of the battery monitoring apparatus 2 can be enhanced.

In the present embodiment, the circuit configuration of the second filter circuit 3 is designed such that the cutoff frequency of the second filter circuit 3 is higher than that of the first filter circuit 4.

Such a circuit configuration can minimize the fluctuation in the cutoff frequency of the first filter circuit 4, the fluctuation being attributed to the addition of the second filter circuit 3.

Second Embodiment

Figure 3:
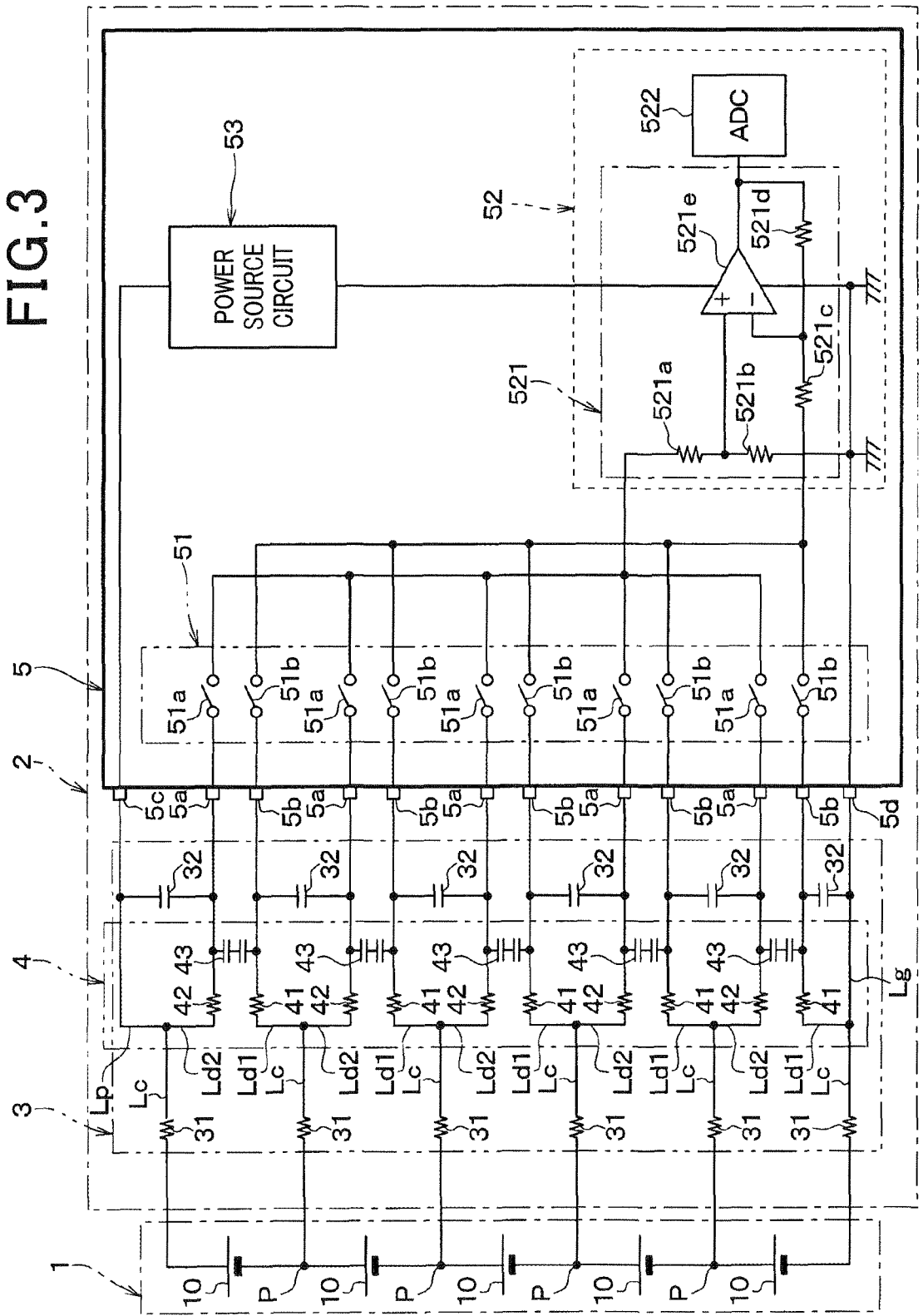
FIG. 3 is a schematic diagram of a battery monitoring apparatus, according to a second embodiment of the present invention.
Figure 4:
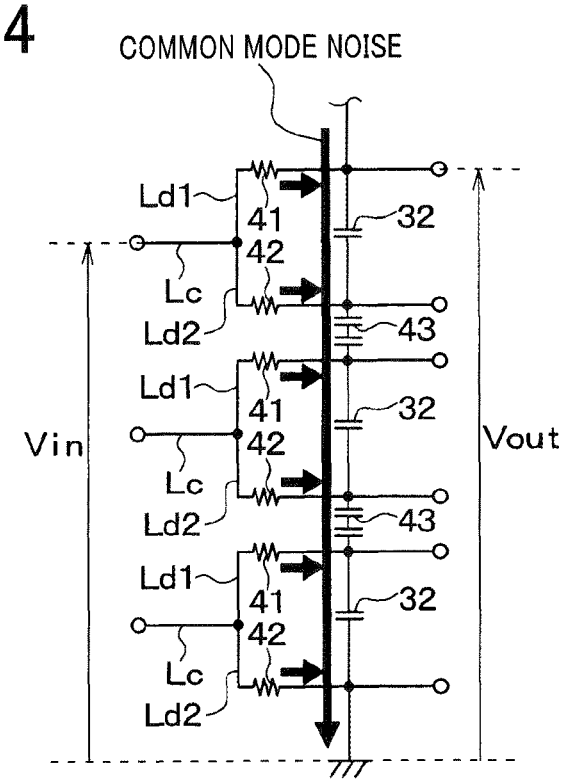
FIG. 4 is a circuit diagram of a second filter circuit according to the second embodiment.
Figure 5:
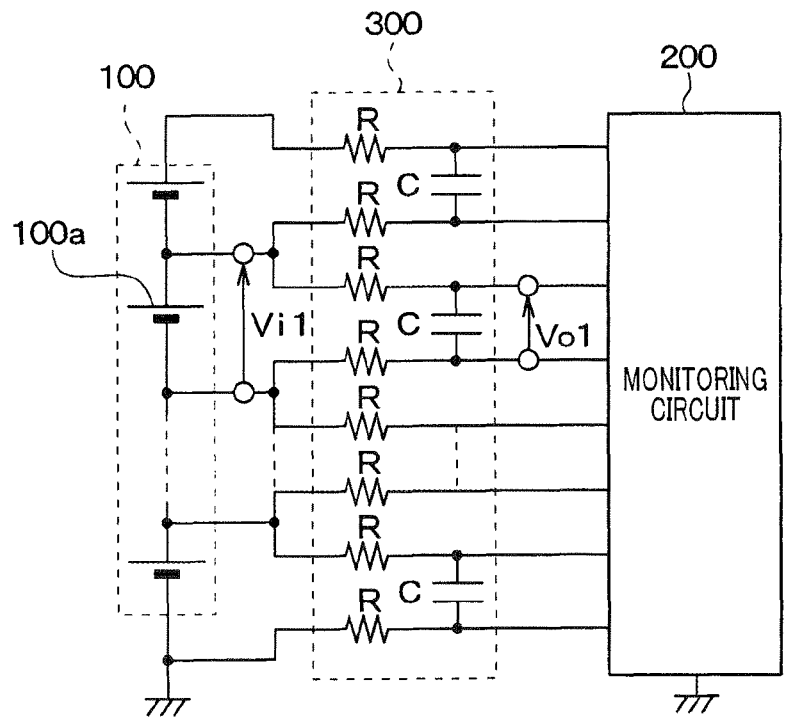
FIG. 5 is a circuit diagram showing a circuit configuration of a filter circuit based on conventional art.
Figure 6:
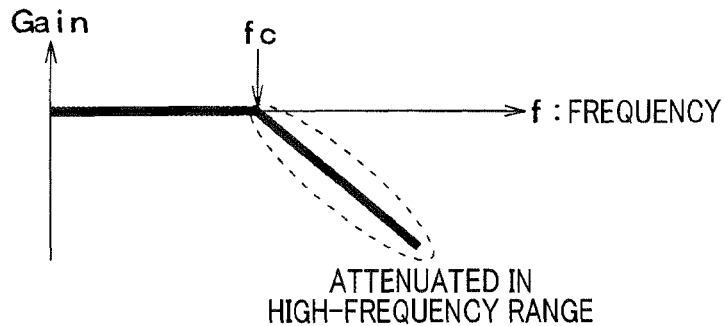
FIG. 6 is a Bode diagram showing frequency characteristics of a filter circuit in related art.
Figure 7:
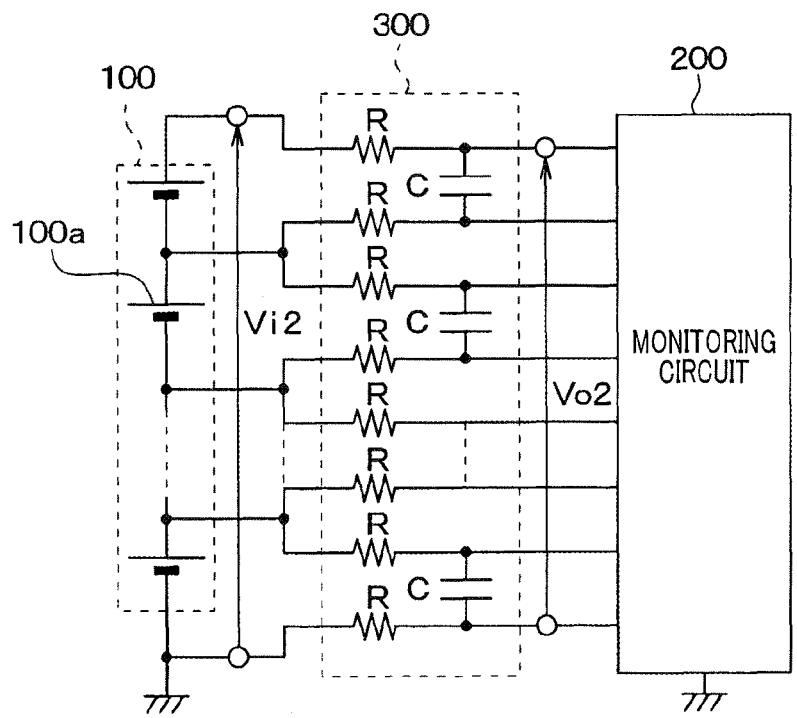
FIG. 7 is a circuit diagram showing a configuration of a filter circuit in related art.
Figure 8:
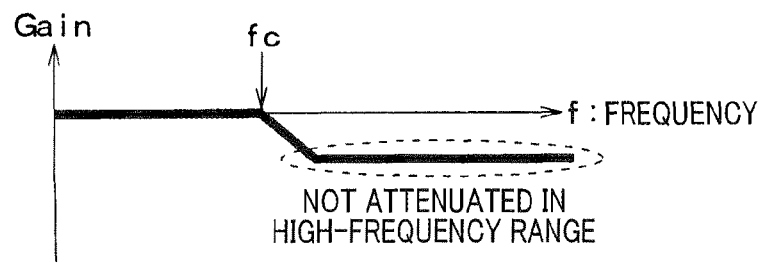
FIG. 8 is a Bode diagram showing frequency characteristics of the filter circuit in related art.

Referring now to FIGS. 3 and 4, hereinafter is described a second embodiment of the present invention. The second embodiment is different from the first embodiment in the circuit configuration of the second filter circuit 3. In the present embodiment, an explanation of components identical with or similar to each other between the first embodiment are omitted or simplified.

As shown in FIG. 3, in the present embodiment, the second capacitors 32 of the second filter circuit 3 are each connected between the first and second branch lines Ld1 and Ld2 of the respective connecting lines. In this case, the second capacitors 32 of the second filter circuit 3 is connected in series with the first capacitors 43 of the second filter circuit 4, without passing through the first resistors 41 and 42.

Specifically, each of the first capacitors 43 is connected between the second branch line Ld2 and the first branch line Ld1 of a pair of common lines Lc which are connected to the pair of electrode terminals of a single battery cell 10. In this case, the second branch line Ld2 is branched from the high-potential side common line Lc, while the first branch line Ld1 is branched from the low-potential side common line Lc. In contrast, each second capacitor 32 is connected between the first and second branch lines Ld1 and Ld2 which are branched from a single common line Lc.

As shown in FIG. 4, in the second filter circuit 3 configured in this way, the first capacitors 43 are connected in series with the second capacitors 32, so that the serially connected capacitors 32 and 43 function as a bypass for common mode noise. In the present embodiment, the first capacitors 43 of the first filter circuit 4 are shared, as capacitor components, with the second filter circuit 3.

Also, the serially connected capacitors 32 and 43 have no interpositions of resistance elements, i.e. the first resistors 41 and 42 and the second resistors 31. Accordingly, no resistance components are applied to the output Vout side of the RC filters that correspond to the respective plurality of battery cells 10. For this reason, even when common mode noise (in-phase fluctuation) is generated in the common lines Lc, the second filter circuit 3 is able to sufficiently attenuate the common mode noise in a high-frequency range.

The rest of the configuration and operation is similar to the first embodiment. Thus, according to the battery monitoring apparatus 2 of the present embodiment, the impact of common mode noise on the monitoring circuit 5 is minimized, without the necessity of providing a ground-type filter configuration. As a result, the cost incurred in the manufacture of the battery monitoring apparatus 2 is reduced to a great extent, and noise immunity of the battery monitoring apparatus 2 is enhanced.

Modifications

As a matter of course, the elements configuring the embodiments described above are not necessarily essential, unless essentiality is particularly and explicitly mentioned, or unless essentiality is considered to be apparent in principle.

Further, the numerical values, such as the number of components, numerical values, amounts and ranges, when referred to in the foregoing embodiments, are not limited to the specified numerical values, unless essentiality is particularly and explicitly mentioned, or unless the numerical values are apparently limited to the specified numerical values in principle.

Furthermore, the shapes, positional relationships and the like of the components, when referred to in the foregoing embodiments, are not limited to these shapes, positional relationships and the like, unless limitation is particularly and explicitly mentioned, or unless the shapes, positional relationships and the like are limited in principle to specified ones Thus, the present invention is not limited to the foregoing embodiments but may be variously modified as exemplified in the following embodiments.

(1) As in the foregoing embodiments, it is desirable that, taking account of the entry of common mode noise via the power source line Lp and the ground line Lg, each of the ends of the second filter circuit 3 is connected to both of the power source line Lp and the ground line Lg. However, this shall not impose a limitation. For example, an end of the second filter circuit 3 may be connected to either one of the power source line Lp and the ground line Lg.

(2) As in the foregoing embodiments, it is desirable that the cutoff frequency of the second filter circuit 3 is lower than that of the first filter circuit 4. However, for example, when fluctuation in the cutoff frequency is unlikely to raise a problem, the cutoff frequency of the second filter circuit 3 may be set to any level.

(3) The foregoing embodiments have been described, taking an example in which a single monitoring circuit 5 is connected to the battery pack 1. However, this shall not impose a limitation. The plurality of battery cells 10 of the battery pack 1 may be divided into groups to form battery blocks, each of which includes a predetermined number of battery cells 10. Then, the monitoring circuit 5 may be connected to each of the battery blocks.

(4) The foregoing embodiments have been described, taking an example in which the battery monitoring apparatus 2 is applied to the battery pack 1 which is installed in a hybrid vehicle or an electric vehicle. However, not being limited to the battery pack 1 installed in a vehicle, the battery monitoring apparatus 2 may be applied such as to a stationary-type battery pack 1.

What is claimed is:

1. A battery monitoring apparatus, comprising:
    a plurality of connection lines that are connected to each of a pair of positive and negative electrode terminals of each of a plurality of battery cells connected in series to form a battery pack;
    a monitoring circuit that is provided with a pair of sensing terminals for each pair of positive and negative electrode terminals of each of the plurality of battery cells, and that includes a voltage detection circuit which detects a cell voltage applied to the pair of sensing terminals;
    a first filter circuit that is provided in a pair of connection lines of the plurality of connection lines connected to the pair of sensing terminals and removes noise generated between the pair of connection lines; and
    a second filter circuit that removes noise,
    wherein:
    the plurality of connection lines includes
        a plurality of common lines that are connected to a plurality of common terminals which are located between adjacent battery cells of the plurality of battery cells and shared between a negative electrode terminal of a high-potential side battery cell of the adjacent battery cells and a positive electrode terminal of a low-potential side battery cell of the adjacent battery cells, and
        first and second branch lines that are branched from each of the common lines, the first branch line being connected to the negative electrode terminal of the high-potential side battery cell, the second branch line being connected to the positive electrode terminal of the low-potential side battery cell;
    the first filter circuit includes
        first resistors that are located on the first and second branch lines connected to the pair of sensing terminals, and
        a first capacitor that is located between the first and second branch lines connected to the pair of sensing terminals; and
    the second filter circuit includes
        a second resistor that is located on the plurality of connection lines, and
        a second capacitor that is connected in series between the plurality of connection lines without passing through the first resistors or the second resistor.

2. The battery monitoring apparatus according to claim 1, wherein
    a cutoff frequency of the second filter circuit is set to be larger than a cutoff frequency of the first filter circuit.

3. The battery monitoring apparatus according to claim 1, wherein
    the second capacitor is connected in series between adjacent common lines of the plurality of common lines without passing through the second resistor.

4. The battery monitoring apparatus according to claim 1, wherein
    the second capacitor is connected in series to the first capacitor between the first and second branch lines of the plurality of connection lines without passing through the first resistors.

5. The battery monitoring apparatus according to claim 1, wherein
    the monitoring circuit includes a power source terminal that is connected to the battery pack via a power source line, and a ground terminal that is connected to a battery pack via ground line;
    the voltage detection circuit is configured to be driven by power supply of the battery pack via the power source line and the ground line; and
    the second filter circuit is connected to either one of the power source line and the ground line.

6. The battery monitoring apparatus according to claim 2, wherein
    the second capacitor is connected in series between adjacent common lines of the plurality of common lines without passing through the second resistor.

7. The battery monitoring apparatus according to claim 2, wherein
    the second capacitor is connected in series to the first capacitor between the first and second branch lines of the plurality of connection lines without passing through the first resistors.

8. The battery monitoring apparatus according to claim 2, wherein
    the monitoring circuit includes a power source terminal that is connected to the battery pack via a power source line, and a ground terminal that is connected to a battery pack via ground line;
    the voltage detection circuit is configured to be driven by power supply of the battery pack via the power source line and the ground line; and
    the second filter circuit is connected to either one of the power source line and the ground line.

9. The battery monitoring apparatus according to claim 3, wherein
    the monitoring circuit includes a power source terminal that is connected to the battery pack via a power source line, and a ground terminal that is connected to a battery pack via ground line;
    the voltage detection circuit is configured to be driven by power supply of the battery pack via the power source line and the ground line; and
    the second filter circuit is connected to either one of the power source line and the ground line.

10. The battery monitoring apparatus according to claim 4, wherein
    the monitoring circuit includes a power source terminal that is connected to the battery pack via a power source line, and a ground terminal that is connected to a battery pack via ground line;
    the voltage detection circuit is configured to be driven by power supply of the battery pack via the power source line and the ground line; and
    the second filter circuit is connected to either one of the power source line and the ground line.

11. The battery monitoring apparatus according to claim 6, wherein
the monitoring circuit includes a power source terminal that is connected to the battery pack via a power source line, and a ground terminal that is connected to a battery pack via ground line;
the voltage detection circuit is configured to be driven by power supply of the battery pack via the power source line and the ground line; and
the second filter circuit is connected to either one of the power source line and the ground line.

12. The battery monitoring apparatus according to claim 7, wherein
the monitoring circuit includes a power source terminal that is connected to the battery pack via a power source line, and a ground terminal that is connected to a battery pack via ground line;
the voltage detection circuit is configured to be driven by power supply of the battery pack via the power source line and the ground line; and
the second filter circuit is connected to either one of the power source line and the ground line.

13. The battery system according to claim 1, wherein the battery pack is installed in a vehicle.

14. A battery system, comprising:
a battery pack that is configured by a plurality of battery cells connected in series to each other; and
a battery monitoring apparatus that includes:
   a plurality of connection lines that are connected to each of a pair of positive and negative electrode terminals of each of the plurality of battery cells;
   a monitoring circuit that is provided with a pair of sensing terminals for each pair of positive and negative electrode terminals of each of the plurality of battery cells, and that includes a voltage detection circuit which detects a cell voltage applied to the pair of sensing terminals;
   a first filter circuit that is provided in a pair of connection lines of the plurality of connection lines connected to the pair of sensing terminals and removes noise generated between the pair of connection lines; and
   a second filter circuit that removes noise,
wherein:
the plurality of connection lines includes
   a plurality of common lines that are connected to a plurality of common terminals which are located between adjacent battery cells of the plurality of battery cells and shared between a negative electrode terminal of a high-potential side battery cell of the adjacent battery cells and a positive electrode terminal of a low-potential side battery cell of the adjacent battery cells, and
   first and second branch lines that are branched from each of the common lines, the first branch line being connected to the negative electrode terminal of the high-potential side battery cell, the second branch line being connected to the positive electrode terminal of the low-potential side battery cell;
the first filter circuit includes
   first resistors that are located on the first and second branch lines connected to the pair of sensing terminals, and
   a first capacitor that is located between the first and second branch lines connected to the pair of sensing terminals; and
the second filter circuit includes
   a second resistor that is located on the plurality of connection lines, and
   a second capacitor that is connected in series between the plurality of connection lines without passing through the first resistors or the second resistor.

* * * * *